US012799600B2

(12) United States Patent
Razavi Hesabi et al.

(10) Patent No.: US 12,799,600 B2
(45) Date of Patent: Nov. 17, 2026

(54) CONTROL OF LIQUID DELIVERY IN AUTO-REFILL SYSTEMS

(71) Applicant: Applied Materials, Inc., Santa Clara, CA (US)

(72) Inventors: Zohreh Razavi Hesabi, Milpitas, CA (US); Cong Trinh, Santa Clara, CA (US); Kevin Griffin, Livermore, CA (US); Alexander V. Garachtchenko, Mountain View, CA (US); Kenric Choi, San Jose, CA (US); Vipin Jose, San Jose, CA (US); Saloni Sawalkar, Milpitas, CA (US); Maribel Maldonado-Garcia, San Jose, CA (US); Kendrick H. Chaney, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 267 days.

(21) Appl. No.: 18/765,688

(22) Filed: Jul. 8, 2024

(65) Prior Publication Data

US 2024/0360561 A1 Oct. 31, 2024

Related U.S. Application Data

(62) Division of application No. 17/189,963, filed on Mar. 2, 2021, now Pat. No. 12,084,771.

(51) Int. Cl.

*C23C 16/52* (2006.01)
*C23C 16/455* (2006.01)
(Continued)

(52) U.S. Cl.

CPC ........ *C23C 16/52* (2013.01); *C23C 16/45544* (2013.01); *G01F 23/0007* (2013.01);
(Continued)

(58) Field of Classification Search

None
See application file for complete search history.

(56) References Cited

U.S. PATENT DOCUMENTS 4,979,545 A 12/1990 Fair
8,082,946 B2 12/2011 Laverdiere et al.
(Continued)

FOREIGN PATENT DOCUMENTS

AU 2008303385 B2 4/2009
CN 105390414 A 3/2016
(Continued)

OTHER PUBLICATIONS

PCT International Search Report and Written Opinion in PCT/US2022/018488 dated Jun. 8, 2022, 12 pages.

*Primary Examiner* — Sean Shechtman
(74) *Attorney, Agent, or Firm* — SERVILLA WHITNEY LLC

(57) ABSTRACT

An system, method and software for controlling processes of an auto-refill system of an ampoule including one or more sensors configured to determine one or more liquid level heights within the ampoule. The auto-refill system having a state machine configured to control the auto-refill system, the state machine having one or more states for refilling the ampoule.

7 Claims, 10 Drawing Sheets

(51) Int. Cl.
*G01F 23/00* (2022.01)
*G05D 9/12* (2006.01)
*H10P 72/00* (2026.01)
*H10P 74/20* (2026.01)

(52) U.S. Cl.
CPC ........... *G05D 9/12* (2013.01); *H10P 72/0604* (2026.01); *H10P 74/20* (2026.01)

(56) References Cited

U.S. PATENT DOCUMENTS

| | | | | |
|---|---|---|---|---|
| 8,151,814 | B2 | 4/2012 | Shimizu et al. | |
| 8,967,253 | B2 * | 3/2015 | Ciglenec | E21B 49/10 700/282 |
| 9,309,469 | B2 | 4/2016 | Evans | |
| 10,557,203 | B2 | 2/2020 | Carlson | |
| 10,876,207 | B2 | 12/2020 | Isobe et al. | |
| 11,869,780 | B2 | 1/2024 | Kawazu et al. | |
| 2008/0168946 | A1 | 7/2008 | Nam et al. | |
| 2015/0299858 | A1 | 10/2015 | Yudovsky et al. | |
| 2016/0052655 | A1 | 2/2016 | Nguyen et al. | |
| 2018/0163307 | A1 | 6/2018 | Carlson | |

FOREIGN PATENT DOCUMENTS

| | | | |
|---|---|---|---|
| CN | 106169432 | A | 11/2016 |
| JP | 2017208418 | A | 11/2017 |
| KR | 20090067456 | A | 6/2009 |
| KR | 20140033166 | A | 3/2014 |

* cited by examiner

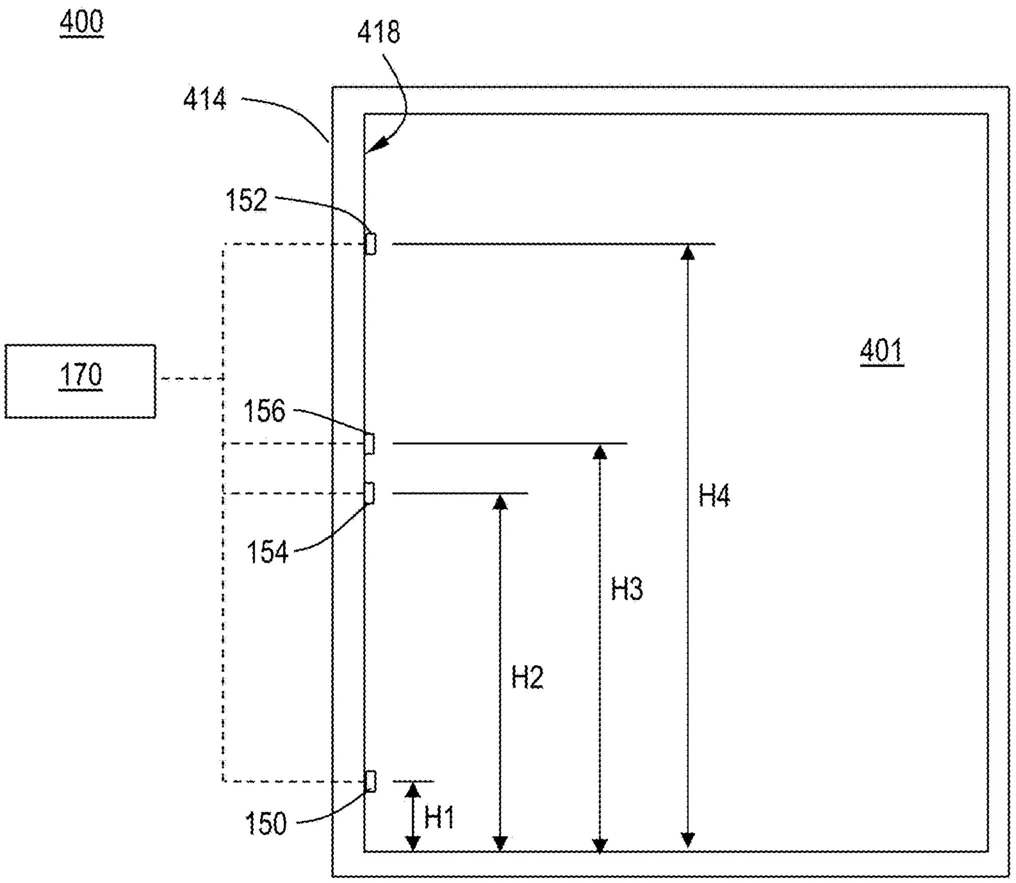

FIG. 5

500

| Liquid Level Height | Signal Name | State Machine Status |
|---|---|---|
| Above the top liquid level sensor | | HIGH HIGH |
| Top liquid level sensor (H4) | Liquid Level HH | |
| Above the second liquid level sensor | | STOP FILL |
| Second liquid level sensor (H3) | Liquid Level H | |
| First liquid level sensor (H2) | Liquid Level L | |
| Below first liquid level sensor | | NEED FILL |
| Bottom liquid level sensor (H1) | Liquid Level LL | |
| Below bottom liquid level sensor | | LOW LOW |

FIG. 6

600

| Liquid Level Height | State Machine Status |
|---|---|
| Liquid Level LL and Wafer Transfer | Batch Start Fill |
| Liquid Level L and Wafer Transfer and Batch Count | Batch Start Fill |
| Between Liquid Level L and Liquid Level H | Batch Stop Fill |
| Recipe Start | Batch Stop Fill |
| Between Liquid Level LL and Liquid Level L | Batch Stop Fill |
| Below Liquid Level L not reached and Wafer Transfer | Batch Mid Fill |

FIG. 7

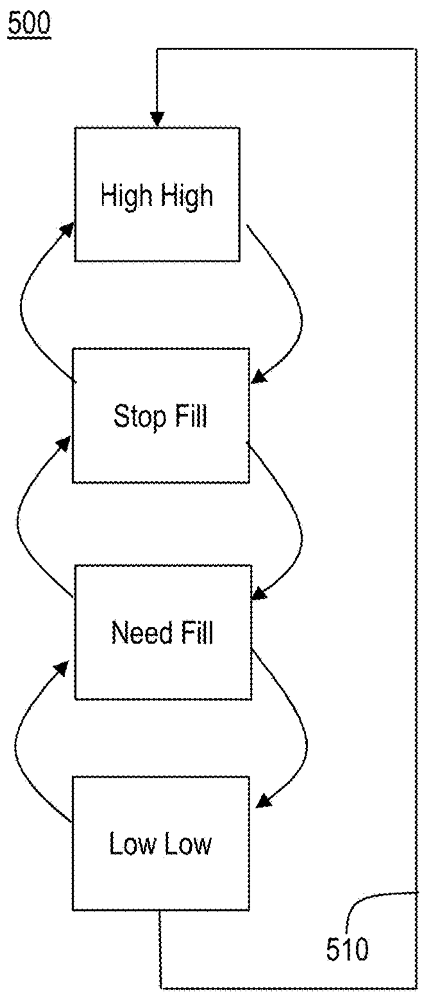

FIG. 8A

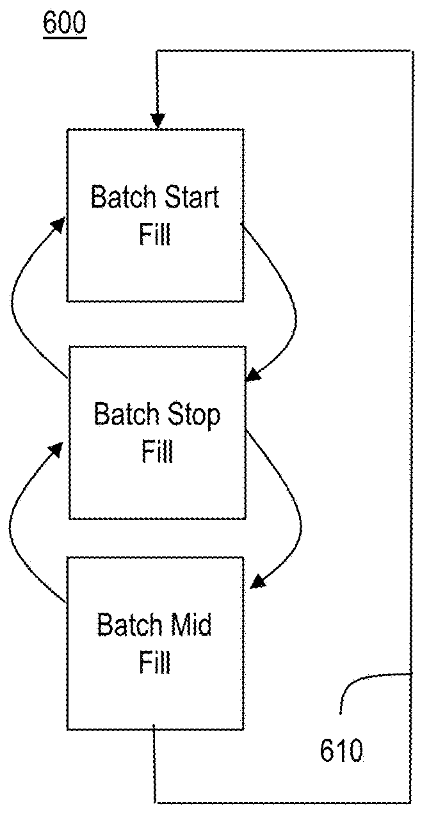

FIG. 8B

CONTROL OF LIQUID DELIVERY IN AUTO-REFILL SYSTEMS

CROSS-REFERENCE TO RELATED APPLICATIONS

This application is a divisional of U.S. patent application Ser. No. 17/189,963, filed Mar. 2, 2021, the entire disclosure of which is hereby incorporated by reference herein.

TECHNICAL FIELD

The present disclosure generally relates to methods of refilling an ampoule for use in semiconductor manufacturing processes to improve system throughput. In particular, the present invention relates to auto-refill systems to control liquid delivery that is adjustable for different applications.

BACKGROUND

Chemical vapor deposition (CVD) is one type of deposition processes employed for depositing layers on a substrate. Physical Vapor Deposition (PVD) is another type of deposition process in which the precursor goes from a condensed phase to a vapor phase and then back to a thin film condensed phase. Atomic layer deposition (ALD), which is also referred to as cyclical deposition, employs chemisorption techniques to deliver precursor molecules on a substrate surface in sequential cycles. Each cycle exposes the substrate surface to a first precursor vapor, a purge gas, a second precursor vapor and the purge gas.

Precursor vapor (e.g., metal-organic precursor vapor) is commonly used for film deposition processes including the thermal deposition of one or more precursor vapors in a processing chamber. Precursors such as metal-organic precursors are usually in liquid or solid form. Precursor vapor is usually generated thermally inside a closed container or ampoule. Molecules of the precursor are then delivered to a substrate surface inside the processing chamber through a gas delivery gas conduit. To prevent the vapor reverting back to its bulk form, the gas delivery conduit is usually thermally controlled to be above the dew point of the particular precursor. In a direct liquid injection process, liquid is injected into a chamber and evaporated at elevated temperature.

Vaporization of precursors and deposition of thin films in a reactive gaseous environment are sensitive to gas flow, and precisely controlled gas flows are required in methods and apparatus for delivering precursors to film deposition chambers. Variability in gas flows causes chamber to chamber variability and product variability.

Over multiple cycles, the closed container or ampoule has to undergo a refilling process during which the pressure and temperature within the closed container or ampoule can vary. Due to lower temperature of fresh liquid, temperature of the liquid in the ampoule drops and causes process drift, which is conventionally controlled by pre-heating the precursor or including heating elements within the closed container or ampoule, both of which increase the overall footprint of the closed container or ampoule, increase complexity of the system and increases costs of manufacturing overall.

Thus, a need exists for refilling processes and methods which mitigate the effects on pressure and temperature of the closed container or ampule during refilling processes.

SUMMARY

One aspect of the present disclosure pertains to methods of refilling an ampoule comprising controlling the operation of an auto-refill system. The auto-refill system has a plurality of liquid level sensors. Each of the plurality of liquid level sensors is positioned at a known location vertically along a height of an inner surface of the ampoule. Each of the liquid level sensors is configured to send a signal to a sensor controller for detecting a liquid level in the ampoule. The auto-refill system comprises the sensor controller and a gas delivery controller. A signal is received from a first liquid sensor of the plurality of liquid level sensors by the sensor controller. The first liquid sensor is positioned a first distance from a bottom of the ampoule and is configured to determine a liquid level L of the ampoule. A signal from a second liquid sensor of the plurality of liquid level sensors is received by the sensor controller. The second liquid sensor is positioned a second distance from the bottom of the ampoule and is configured to determine a liquid level H of the ampoule. A refill operation of each of the plurality of sensors is determined. The sensor controller sends a signal to the gas delivery controller. The signal of the first liquid sensor is configured to prompt the gas delivery controller to activate a bulk valve and the signal of the second liquid level sensor is configured to prompt the gas delivery controller to deactivate the bulk valve. The gas delivery controller is prompted to activate the bulk valve when the liquid level is at the low liquid level L, and the gas delivery controller is prompted to deactivate the bulk valve when the liquid level is at the fill liquid level state.

Additional embodiments of the disclosure are directed to computer program products comprising computer executable code embodied in a non-transitory computer readable medium that, when executing on one or more computing devices, performs the steps of: controlling operation of an auto-refill system with a plurality of liquid level sensors, each of the plurality of liquid level sensors positioned at a known location vertically along a height of an inner surface of the ampoule, each of the liquid level sensors configured to detect a level of liquid in the canister; receiving a signal from a first liquid sensor and second liquid sensor of the plurality of liquid level sensors, the signal from the first liquid sensor and the second liquid sensor corresponds to a refill function of a piece of the auto-refill system, the auto-refill system comprising a bulk valve; determining the refill function assigned to each of the plurality of sensors, the first liquid sensor assigned to activate a bulk valve for, the second liquid sensor assigned to deactivate the bulk valve; activating the bulk valve when the liquid level is at first liquid sensor; and deactivating the bulk valve when the liquid level is at the second liquid sensor.

Further embodiments of the disclosure are directed to methods of refilling an ampoule. The methods comprise monitoring a liquid level in an ampoule using at least one liquid level sensor spaced by a known height within the ampoule. A plurality of wafers is processed until the liquid level in the ampoule drops to change the activation state of the liquid level sensor from a first state to a second state. Processing the plurality of wafers continues after activation state change and the wafers are counted after the activation state change. A wafer change event activation is determined and if a predetermined number of wafers have been processed after activation state change and the wafer change event is activated, refilling the liquid level in the ampoule until the activation state of the liquid level sensor changes to the first state.

BRIEF DESCRIPTION OF THE DRAWINGS

FIG. 5 shows a sectioned view of an ampoule in accordance with one or more embodiment of the disclosure;

FIG. 6 shows condition table of a state machine in accordance with one or more embodiment of the disclosure;

FIG. 7 shows condition table of a state machine in accordance with one or more embodiment of the disclosure;

FIG. 8A shows a schematic of a state machine in accordance with one or more embodiment of the disclosure;

FIG. 8B shows a schematic of a state machine in accordance with one or more embodiment of the disclosure;

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used herein, the terms “ampoule”, “canister” and “closed container” are used interchangeably and refer to precursor ampoules in low-vapor pressure and high-vapor pressure applications. The precursor ampoule may be of a bubbler type where an inlet carrier gas goes into a tube that is submerged into the precursor; and a cross-flow ampoule where the carrier gas sweeps the headspace in the ampoule.

With reference to the figures as set forth below, a linear arrangement is depicted, however any suitable layout of components and handling hardware may be usefully employed according to a particular process design. Further, tools such as valves, gas delivery apparatuses, controllers, ampoules and the like may be employed, along with sensors (such as pressure sensors, optical sensors, contamination sensors, etc.), timers, switches, actuators, relays, motors, and so forth, may be suitably employed to control or monitor processes. All such variations are intended to fall within the scope of the systems described herein.

Figure 1A:
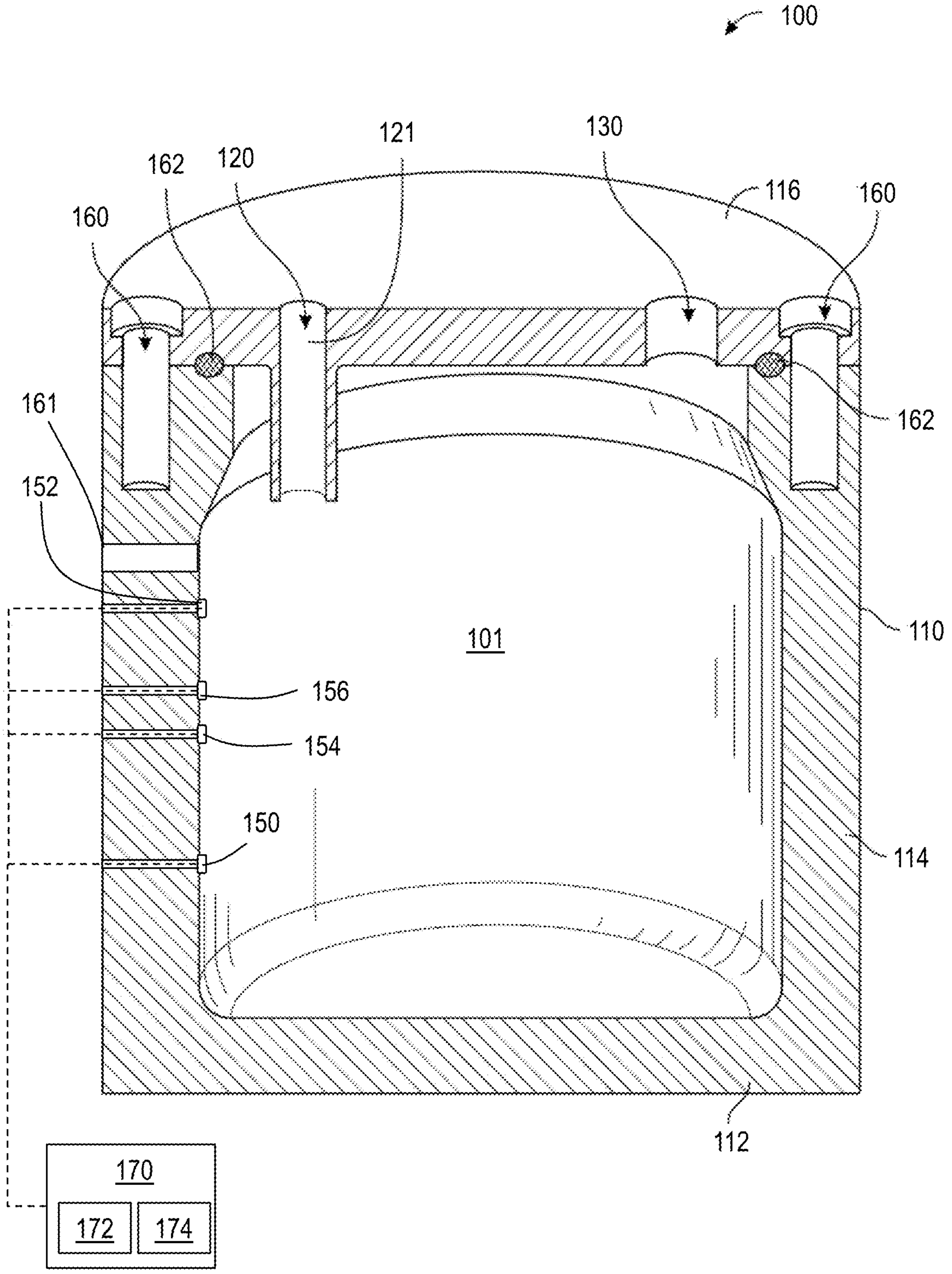
FIG. 1A shows a sectioned view of an ampoule in accordance with one or more embodiment of the disclosure.

FIG. 1 illustrates an ampoule 100 for use with semiconductor manufacturing reagents. The ampoule 100 includes a container 110 with a bottom 112, sidewalls 114 and a lid 116 enclosing a volume 101. An inlet port 120 and outlet port 130 are in fluid communication with the volume 101. In some embodiments, the ampoule 100 comprises more than one inlet port 120 for the delivery of a carrier gas, a precursor gas or a precursor liquid.

The inlet port 120 is generally configured to allow a connection to a gas source and may have suitable threaded or sealing connections. The inlet port 120 has a passage 121 with an inner diameter defining a cross-sectional width of the passage 121. The passage 121 has a bottom end 125 that can be curved, tapered or come to a flat end.

In some embodiments, the inlet port 120 has a showerhead on an end of the inlet port 120 located within the volume 101. The showerhead is configured to direct a flow of gas or liquid and, in some embodiments, includes one or more nozzles.

An outlet port 130 is also in fluid communication with the volume 101 in the container 110. The outlet port 130 is generally configured to be able to connect to a line to allow the gases exiting the container 110 to flow to a processing chamber (or other component). The outlet port 130 may have a threaded connection to allow a gas line to be connected.

In some embodiments, as shown in FIG. 1, the lid 116 is a separate component from the bottom 112 and sidewalls 114. The lid 116 can be connected to the sidewalls 114 of the container 110 using removable bolts through appropriately shaped openings 160. The openings 160 may have a threaded portion to allow for easy connection of a threaded bolt. The bolts can be removed to allow the lid 116 to be removed from the container 110 so that the precursor in the container 110 can be changed or added. In some embodiments, the container 110 includes an O-ring 162 positioned between the lid 116 and the sidewalls 114 to form a fluid tight seal. In some embodiments, the ampoule is configured to contain a solid precursor.

The ampoule 100 further includes a plurality of liquid level sensors positioned along the inside surface of the sidewalls 114. As shown in FIG. 1, there are at least four liquid level sensors. Each of the at least four liquid level sensors are positioned vertically along a height of the inner surface of the ampoule. A bottom liquid level sensor 150 is positioned a distance from the bottom 112 of the ampoule 100. A top liquid level sensor 152 is positioned a distance from the lid 116. Two precision liquid level sensors are located between the bottom liquid level sensor 150 and the top liquid level sensor 152. In particular, a first liquid level sensor 154 is positioned above the bottom liquid level sensor 150 and below the top sensor 152, and a second liquid level sensor 156 is positioned above the first liquid level sensor 156 and below the top sensor 152. In some embodiments, the top liquid level sensor is positioned below a vent (opening 160).

Each of the bottom liquid level sensor 150, top liquid level sensor 152, the two precision liquid level sensors (first liquid level sensor 154 and second liquid level sensor 156) are connected and controlled by a sensor controller 170. In embodiments where more than four sensors are implemented, each of the more than four sensors are connected and controlled by the sensor controller 170. The sensor controller 170 is configured to send and receive a liquid level signal from one or more of the liquid level sensors (150, 152, 154, 156) to indicate when a certain liquid level is reached. In some embodiments, the sensor controller 170 is configured to send the liquid level signal to a gas delivery controller (not shown) as explained in further detail below.

As explained in further detail below, in the present embodiment, the bottom liquid level sensor 150 is configured to indicate a lowest liquid level; the top liquid level sensor 152 is configured to indicate a highest liquid level. It will be appreciated that the lowest liquid level and the highest liquid level in some embodiments are set to indicate minimum and maximum desirable liquid levels dependent on the number of batches or the chemical characteristics of the precursor, and not the minimum and maximum volumes of precursor the ampoule 100 can contain within.

As explained in further detail below, in the present embodiments, the two precision liquid level sensors (first liquid level sensor 154 and second liquid level sensor 156) are configured to indicate start and stop levels for a precision auto-refill system 200, wherein the first liquid level sensor 154 is configured to indicate that the ampoule 100 needs to be refilled, thus prompting the controller 170 to activate the auto-refill system 200, and the second liquid level sensor 156 is configured to indicate that the ampoule 100 has been refilled, thus prompting the controller to de-activate the auto refill system 200.

The sensor controller 170 according to one or more embodiments comprises a processor 172, a memory 174 coupled to the processor, input/output devices coupled to the sensor controller 170 and support circuits to provide communication between the different components of the system or apparatus, operation of the one or more of the liquid level sensors (150, 152, 154, 156). In some embodiments, the sensor controller 170 is in communication with the gas delivery controller 291 and is configured to send a signal to the gas delivery controller 291.

Figure 1B:
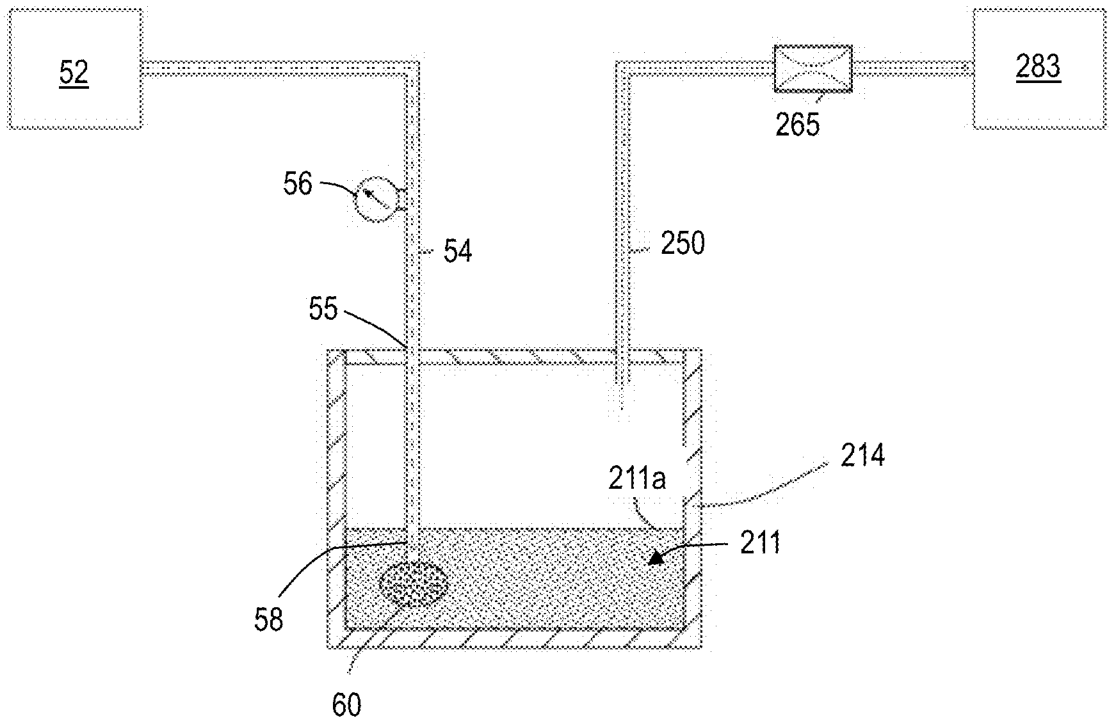
FIG. 1B shows a schematic of a gas delivery system in accordance with one or more embodiments of the present disclosure.
Figure 2:
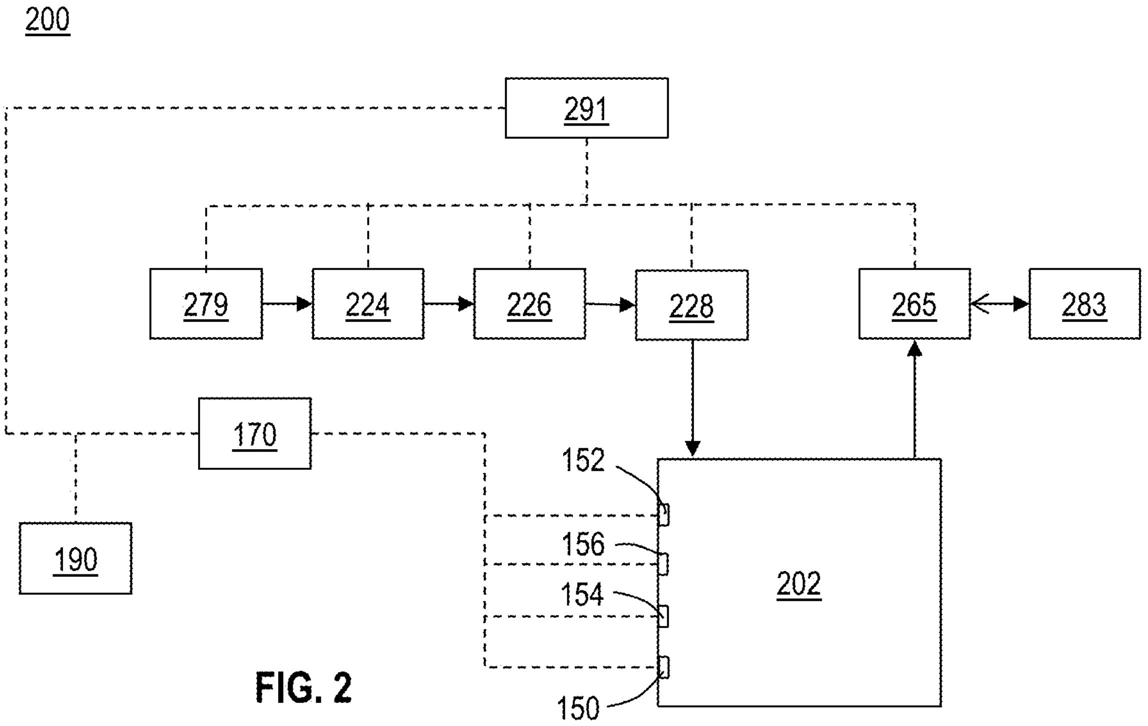
FIG. 2 shows a schematic of an auto-refill system in accordance with one or more embodiments of the disclosure.

FIGS. 1B, 2 and 3 show schematic representations of a precursor delivery system 50 and an auto-refill system 200. The precursor delivery system 50 is configured to deliver precursor vapor or liquid to an ampoule 202, and the auto-refill system 200 is configured to refill the ampoule 202 during various stages of substrate processing and deposition as explained in further detail below. The auto-refill system is connected to a gas delivery system 229, the gas delivery system 229 configured to deliver a push gas into the ampoule 202. FIG. 1B illustrates a conventional precursor delivery system 50 for the delivery of precursor vapor or liquid into an ampoule 202.

The precursor delivery system 50 comprises a precursor supply 52 which is connected to an inlet conduit 54. The precursor supply 52 provides a liquid or gas to the ampoule 202 via an inlet conduit 54 connected to an inlet port 55 of the ampoule 202. In some embodiments, a pressure sensor 56 is downstream from the precursor supply 52 and is configured to measure the pressure of the precursor entering the ampoule 202. In some embodiments, the precursor delivery system 50 further comprises a mass flow controller or a volume flow controller positioned downstream from the precursor supply 52 to regulate the flow from the precursor supply 52 to the inlet conduit 54. In some embodiments, upstream from the mass flow controller, the precursor delivery system 50 further includes a heater configured to heat the precursor supply 52 to a desired temperature. In some embodiments, the actual gas supply source is a separate component and the precursor supply 52 is any suitable inlet connector that can be connected to the gas supply source, as the skilled artisan will be familiar with.

In some embodiments, an inside end 58 of the inlet conduit 54 is submerged in a liquid precursor 211 during processing of a substrate in which precursor vapor is delivered to a processing chamber 283 during a film formation process. In other embodiments, the inside end 58 of the inlet conduit is not submerged in the liquid precursor 211 during processing of a substrate in which precursor vapor is delivered to the processing chamber 283 during a film formation process. In some embodiments, the inside end 58 of the inlet conduit 240 has a component to redirect or diffuse the flow of carrier gas through the inlet conduit 54. In some embodiments, a sparger 60 is positioned on the inside end 58 of the inlet conduit 54. The sparger 60 is in fluid communication with the inlet conduit 55 to allow a gas flowing through the inlet conduit 54 to pass through the sparger 60 to bubble through the liquid precursor 211.

The gas delivery system 229 further comprises an outlet conduit 250 connected to the outlet port of the ampoule 202 and configured to allow gas to flow out of the ampoule 202. In some embodiments, the inside end 58 of the inlet conduit 54 is above the liquid level surface 211*a* of liquid precursor 211. In one or more embodiments, the inside end 58 of the inlet conduit 54 and the inside end 252 of the outlet conduit 250 do not contact the liquid precursor 211. In an embodiment of this sort, a vapor of the precursor in the headspace above the liquid precursor 211 is carried through the outlet conduit 250 as carrier gas exiting the ampoule mixed with the vapor of the precursor 205, which is delivered to the processing chamber 283.

In an 216 far enough to reduce the amount of precursor being delivered.

In the embodiments shown, the outlet is connected to a processing chamber 283 such as a film forming chamber into which precursor vapor entrained in a carrier gas is delivered for film deposition process. The processing chamber can be any suitable processing chamber known to the skilled artisan including, but not limited to, an atomic layer deposition (ALD) chamber, a plasma-enhanced atomic layer deposition (PEALD) chamber, a chemical vapor deposition (CVD) chamber, a plasma enhanced chemical vapor deposition (PECVD) chamber.

In some embodiments, the gas delivery system 229 can be retrofit onto an existing or conventional ampoule. Some embodiments are directed to an apparatus or a method that include the gas delivery system 229 that is configured to be retrofit onto an existing or conventional ampoule lid.

Figure 3A:
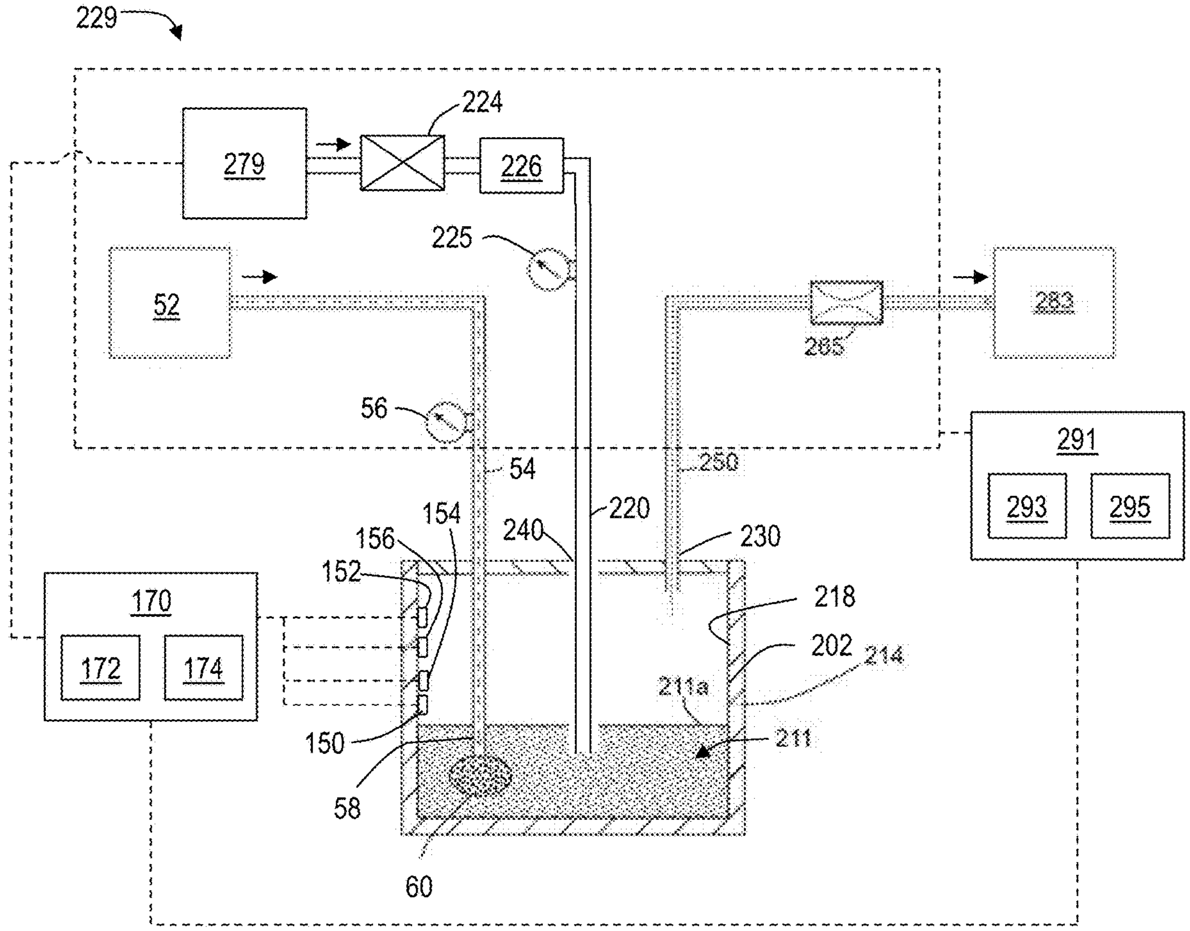
FIG. 3A shows a schematic of an auto-refill system in accordance with one or more embodiments of the disclosure.
Figure 3B:
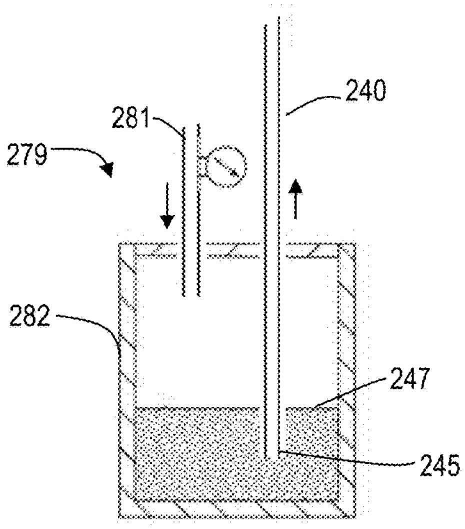
FIG. 3B shows a schematic of a bulk reservoir of auto-refill system in accordance with one or more embodiments of the disclosure.

FIGS. 2, 3A and 3B illustrate schematic representations of an auto-refill system 200 with the ampoule 202 connected to a gas delivery system 229 of the auto refill system 200. The auto-refill system 200 comprises an exemplary ampoule 202 having volume 201 configured to contain a fluid in the interior of the ampoule 202, the interior of the ampoule 202 defined by sidewalls 214 and an inside surface 218.

As shown in FIGS. 3A and 3B, the gas delivery system 229 comprises a gas supply 279 which provides a push gas to the ampoule 202 via an inlet conduit 240 connected to an inlet port 220 of the ampoule 202. In some embodiments, the gas supply 279 contains a carrier gas 203 such as argon, helium or nitrogen. In some embodiments, the carrier gas 203 is liquified prior to entry into the ampoule 202. The carrier gas 203 pushes the precursor through the outlet conduit 250 for deposition in the processing chamber 283. In some embodiments, the actual gas supply source is a separate component and the gas supply 279 is any suitable inlet connector that can be connected to the gas supply source, as the skilled artisan will be familiar with.

As shown in FIG. 3B, an outlet port 241 of the inlet conduit 240 is below the liquid level surface 211*a* of liquid precursor 211 such that the carrier gas 203 carries and pushes the liquid precursor 211 to the outlet conduit 250. As shown in FIG. 3B, in some embodiments the gas supply 279 includes a bulk reservoir 282 located outside the processing chamber 283. The bulk reservoir 282 is of a large volume in the range of 20 liters to 100 liters. The push pressure is maintained at an inlet 281 of the bulk reservoir 282 at a certain value such that the carrier gas remains liquified within the bulk reservoir 282 and such that a reservoir-side inlet 245 of the inlet conduit 240 remains below a carrier gas liquid level 247 within the bulk reservoir 282.

Referring back to FIG. 3A, connected upstream from the gas supply 279, the gas delivery system 229 can utilize a mass flow controller or a volume flow controller to regulate the flow of the carrier gas 203 from the gas supply 279 to the inlet conduit 240. In the present embodiment, a bulk valve 224 is utilized. Upstream from the bulk valve 224, the gas delivery system 229 can further include a heater 226 configured to heat the gas supply 279 to a desired temperature.

In some embodiments, the gas delivery system 229 further comprises a transducer or gas pressure sensor 228 configured to monitor pressure of the gas in the gas delivery system 229, e.g., any suitable gas pressure sensor such as a manometer or a pressure transducer suitable for use in a chemical vapor deposition or atomic layer deposition system. In some embodiments, the gas delivery system 229 further comprises a flow restrictive device in the form of a needle valve 265 downstream from the ampoule 202 and the needle valve 265 is configured to variably adjust the pressure of the gas to a predetermined gas pressure value. The needle valve controls gas/vapor flows to a processing chamber. Typical types of flow restrictive devices include a VCR orifice gasket flow restrictor, a porous metal flow restrictor, and needle valve. However, it was determined that only a needle valve could be utilized to reliably deliver precursors to a film formation chamber, particularly for precursors that are susceptible to formation of particulate in the gas delivery system.

In one or more embodiments, the gas delivery system 229 includes a gas delivery controller 291 in communication with the bulk valve 224, heater 226, gas pressure sensor 228, needle valve 265, and the gas supply 279. In some embodiments, the gas delivery controller 291 is configured to send and receive the liquid level signal from one or more of the liquid level sensors (150, 152, 154, 156) of the signal controller 170 and activate one or more components of the gas delivery system 229. The gas delivery controller 291 is also configured to send and receive a pressure signal from the gas pressure sensor 228, the pressure signal indicating the pressure of the gas delivery system 229.

In some embodiments, the gas delivery controller 291 is configured to activate or deactivate the gas supply 279. In some embodiments, the gas delivery controller 291 is configured to send a signal to the gas supply 279, the gas delivery controller 291 configured to increase or decrease the gas supply 279. Likewise, in some embodiments, the gas delivery controller 291 is configured to send a signal to the bulk valve 224, the gas delivery controller configured to activate or deactivate the bulk valve 224 and, in some embodiments, the gas delivery controller 291 is configured to increase or decrease the bulk valve 224.

In some embodiments, the gas delivery controller 291 is configured to send a signal to adjust the needle valve 265 to change the gas pressure in the gas delivery system 229. In one or more embodiments, the needle valve 265 comprises a manual control including, for example, a Vernier handle configured to provide fine adjustment of gas flow through the needle valve. A needle valve with a Vernier handle in some embodiments provides fine control to allow for precise regulations of gas flow and pressure in the gas delivery system 229. The Vernier handle in some embodiments may include a scale (not shown) on the handle that can be used for visual detection of movement and adjustment of the Vernier handle to allow for precise adjustment of gas pressure in the gas delivery system 229. In other embodiments, the needle valve 265 comprises a motor controlled valve. Examples of motor controlled valves comprise motor controlled actuator valves, for example, a pneumatic controlled valve, an electric controlled valve, a hydraulic controlled valve or a piezoelectric controlled linear actuator valve. In one or more embodiments, the gas delivery controller 291 controls operation of the motor controlled valve.

The gas delivery controller 291 according to one or more embodiments comprises a processor 293, a memory 295 coupled to the processor, input/output devices coupled to the processor 293, and support circuits to provide communication between the different components of the system or apparatus, operation of the bulk valve 224, heater 226 needle valve 265, the gas supply 279 and flow of gas to the processing chamber 283. The gas delivery controller 291 is in communication with the gas pressure sensor 225 and the needle valve 265 to regulate the pressure of the gas in the gas delivery system 230. In some embodiments, the gas delivery controller 291 is in communication with the gas pressure sensor 225 and the needle valve 265, and the gas delivery controller 291 is configured to send a signal to adjust the needle valve 265 to change the gas pressure in the gas delivery system 230. In embodiments in which the needle valve 265 is a manually controlled needle valve, the signal can be an alert to indicate that the needle valve 265 requires adjustment to regulate or change the gas pressure in the gas delivery system. In specific embodiments, the gas delivery controller 291 adjusts opening and closing of the needle valve 265 in embodiments in which the needle valve 265 comprises a motor controlled valve. In such embodiments, the gas delivery controller 291 is configured to automatically operate the needle valve 265 to regulate or change the gas pressure in the gas delivery system 230, for example to a predetermined gas pressure value.

Processes to operate the auto-refill system 200 may generally be stored in the memory of, for example, the sensor controller 170, the gas delivery controller 291 or other controller, as a software routine that, when executed by the processor, causes the auto-refill system 200 to perform methods described in the present disclosure. The software routine may also be stored and/or executed by a second processor (not shown) that is remotely located from the hardware being controlled by the processor. Some or all of the methods of the present disclosure may also be performed by hardware. As such, the methods described in this disclosure are implemented in software and executed using a computer system, by hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the sensor controller 170 and the gas delivery controller 291 are a single controller having a processor and a memory coupled to the processor, input/output devices coupled to the processor, and support circuits to provide communication between the different components of the auto-refill system 200.

Some or all of the methods of the present disclosure may also be performed by hardware. As such, the methods described in this disclosure are implemented in software and executed using a computer system, by hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

The memory 174 of the sensor controller 170 and the memory 294 of the gas delivery controller 291 of one or more embodiments includes one or more of transitory memory (e.g., random access memory) and non-transitory memory (e.g., storage) and the memory of the processor may be one or more of readily available memory such as random access memory (RAM), read-only memory (ROM), floppy disk, hard disk, or any other form of digital storage, local or remote. The memory can retain an instruction set that is operable by the processor to control parameters and components of the system. The support circuits are coupled to the processor for supporting the processor in a conventional manner. Circuits may include, for example, cache, power supplies, clock circuits, input/output circuitry, subsystems, and the like.

In one or more embodiments, the sensor controller 170 and the gas delivery controller 291 execute instructions to deliver a flow of precursor or reactive gas from the ampoule 202 to the processing chamber 283.

The auto-refill system 200, as shown in FIG. 2, further includes control software 190. The control software 190 performs a variety of tasks associated with refilling the ampoule within the auto-refill system 200. By way of example and not limitation, the control software 190 may control operation of the sensor controller 190, the gas delivery controller 291 and one or more of the components of the auto-refill system 200, including the liquid level sensors (150, 152, 154, 156), the bulk valve 224, heater 226, gas pressure sensor 228, needle valve 265, and the gas supply 279. Each of these hardware items may have a proprietary or open programming interface, and the control software 190 may also, or instead, manage communications with these hardware items, such as by interpreting data from the hardware or providing control signals to the hardware. At a more abstract level, the control software 190 may coordinate the various components of the auto-refill system 200 to activate or de-activate components of the auto-refill system 200, such as by coordinating and controlling operations of one or more of the liquid level sensors (150, 152, 154, 156), the bulk valve 224, heater 226, gas pressure sensor 228, needle valve 265 or the gas supply 279. The control software 190 may also provide an external programmatic interface for controlling the auto-refill system 200 and the heater 226 needle valve 265, the gas supply 279 and flow of gas to the processing, and may also, or instead, provide information to a wider computer infrastructure, such as event logs, status information, and the like. As will be described in greater detail below, the control software 190 may employ a neural network to calculate liquid levels of the precursor within the ampoule and to calculate states of a state machine. The control software 190 may also provide a graphical user interface for user interaction with the auto-refill system 200 and related process data. More generally, the control software 190 may support any software functions associated with status, monitoring, maintenance, evaluation, programming, control, and/or operation of the auto-refill system 200, whether with respect to particular devices or components of the auto-refill system 200 or the auto-refill system 200 as a whole.

Figure 4:
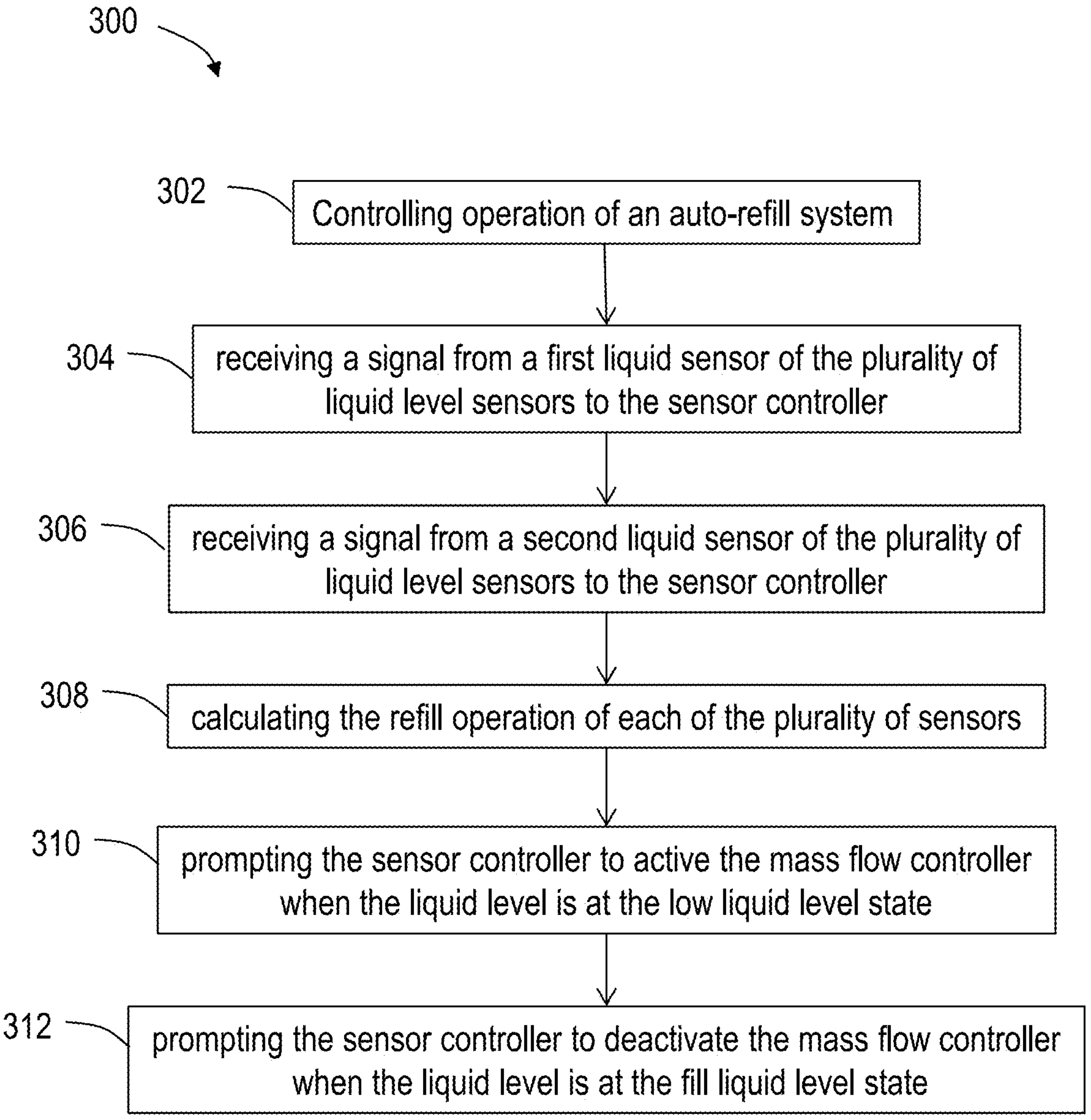
FIG. 4 shows a method of refilling an ampoule in accordance with one or more embodiments of the disclosure.

Some embodiments of the disclosure are directed to methods of controlling the auto-refill system 200 for precisely refilling an ampoule. Referring now to FIG. 4, in one or more embodiments, a method 300 comprises, at operation 302, controlling operation of an auto-refill system having a plurality of liquid level sensors. In some embodiments, each of the plurality of liquid level sensors positioned at a known location vertically along a height of an inner surface of the ampoule, each of the liquid level sensors configured to detect a level of liquid in the ampoule; each of the plurality of sensors corresponds to a refill function of a piece of the auto-refill system. In some embodiments, the auto-refill system comprises a sensor controller and a mass flow controller of one or more of the previous described embodiments.

At operation 304, the method further comprises receiving a signal from a first liquid sensor of the plurality of liquid level sensors to the sensor controller and, at operation 306, receiving a signal from a second liquid sensor of the plurality of liquid level sensors to the sensor controller. The first liquid sensor positioned a first distance from a bottom of the ampoule, the first liquid sensor configured to determine a low liquid level state of the ampoule. The second liquid sensor positioned a second distance from the bottom of the ampoule, the second liquid sensor configured to determine a full liquid level state of the ampoule.

At operation 308, the method further comprises determining a refill operation of each of the plurality of sensors, the sensor controller sending a signal to the gas delivery controller, the signal of the first liquid sensor configured to prompt the gas delivery controller to activate a mass flow controller, the signal of the second liquid sensor configured to prompt the gas delivery controller to deactivate the mass flow controller. Mass flow controllers (MFC) are used to describe the operation of the various embodiments of the disclosure. However, the skilled artisan will recognize that the scope of the disclosure is not limited to MFCs and that other gas delivery systems (e.g., diaphragms, ALD valves) can be used. At operation 310, the method further comprises prompting the gas delivery controller to activate the mass flow controller when the liquid level is at the low liquid level L and at operation 312 the method further comprises prompting the gas delivery controller to deactivate the mass flow controller when the liquid level is at liquid level H.

In some embodiments, the sensor controller is configured to send and receive a liquid level signal from one or more of the liquid level sensors to indicate when a certain liquid level is reached. The first liquid level sensor and second liquid level sensor are configured to indicate activation and deactivation of the mass flow controller. The first liquid level sensor is configured to indicate and send a signal to the sensor controller that the ampoule needs to be refilled, thus prompting the controller to activate the mass flow controller, and the second liquid level sensor is configured to indicate and send a signal to the sensor controller that the ampoule has been refilled, thus prompting the sensor controller to deactivate the mass flow controller.

In some embodiments, the method further comprises operating the auto-refill system with a state machine. In some embodiments, the state machine including a plurality of states associated with a plurality of operations of the sensor controller. With reference to FIGS. 5 and 6, the plurality of states of the state machine corresponds to a liquid level of the ampoule.

FIG. 5 illustrates a schematic representation of the liquid level sensors (150, 152, 154, 156) of at least FIG. 1 with corresponding liquid level heights inside a volume 401 of an exemplary ampoule 400. FIG. 6 illustrates the plurality of states of the state machine corresponding to the liquid level heights inside the volume 401 relative to the liquid level sensors (150, 152, 154, 156).

As shown in FIG. 5, the ampoule 400 comprises sidewalls 414 having an inside surface 418. The liquid level sensors (150, 152, 154, 156) are disposed along the vertical heights (H1, H2, H3 and H4) of the inside surface 418 of sidewalls 414. As used in this manner, the term "vertical" means a direction perpendicular to the bottom of the ampoule. Vertical height H1 corresponds to a liquid level at or below the bottom liquid level sensor 150. The bottom liquid level sensor 150 is configured to send a signal to the sensor controller 170 if the liquid level has reached or is below the vertical height H1. Vertical height H2 corresponds to a liquid level at or below the first liquid level sensor 154. The first liquid level sensor 154 is configured to send a signal to the sensor controller 170 if the liquid level has reached or is below the vertical height H2. Vertical height H3 corresponds to a liquid level at or above the second liquid level sensor 156. In some embodiments, the second liquid level sensor 156 of vertical height H3 is configured as a production control sensor, wherein if on, it initiates a dump process as explained in further detail below. The second liquid level sensor 156 configured to send a signal to the sensor controller 170 if the liquid level has reached or is above the vertical height H3. Vertical height H4 corresponds to a liquid level at or above the top liquid level sensor 152. The top liquid level sensor 152 is configured to send a signal to the sensor controller 170 if the liquid level has reached or is above the vertical height H1. In some embodiments, the top liquid level sensor 152 of vertical height H4 is configured as a boundary sensor, wherein if on, it initiates a dump and warning process as explained in further detail below.

The vertical heights (H1, H2, H3, H4) of the liquid level sensors (150, 152, 154, 156) can be any height along the sidewall of the ampoule. To determine the vertical heights (H1, H2, H3, H4), various optimizations of precursor chemicals may be studied as a function of the liquid level. In some embodiments, a vertical height is chosen to keep a minimum amount of a precursor chemical in an ampoule to minimize decomposition of the precursor chemical. In some embodiments, the vertical heights (H1, H2, H3, H4) can be determined in accordance with the growth per cycle of a precursor chemical. In some embodiments, the vertical heights (H1, H2, H3, H4) can be determined in accordance with the growth per cycle of a precursor chemical as a function of the temperature of a precursor chemical within an ampoule as the rate of evaporation of the precursor chemical and the decomposition of the precursor chemical can vary at a given temperature. In some embodiments, the vertical height H1 is selected to have a minimum amount of decomposition.

As shown in FIG. 6, each of the aforementioned liquid level heights of FIG. 5 corresponds to a status of the state machine 500. FIG. 6 illustrates the status of the state machine 500 under an exemplary single batch. A single batch is defined as a number of substrates processed under a full process recipe to be run. In particular, a number of substrates processed under a full process recipe can be for any number of substrates processed during a continuous substrate manufacturing process for a specific process recipe. Multiple batches can be of the same or different process recipes. Multiple batches can comprise sequential and uninterrupted batches of the same recipe with or without downtime. An ampoule of the present disclosure can be refilled before a single or multiple batches, after a single or multiple batches, in-between batches or during batches.

For a single batch the following states of the state machine 500 can occur, and the state machine 500 can prompt one or more of the components of the auto-refill system 200 to perform an action. Said prompts can occur during, before or after the single batch. When the liquid level height is at or below the bottom liquid level sensor 150 (vertical height H1), the state machine 500 receives a signal Liquid Level LL and the state machine 500 is placed in a Low Low state. When the liquid level height is below the first liquid level sensor 154 (vertical height H2), the state machine 500 receives a signal Liquid Level L and the state machine 500 is placed in a Need Fill state. When the liquid level height is at or above the second liquid sensor 156 (vertical height H3) the state machine receives a signal Liquid Level H and the state machine 500 is placed in a Stop Fill state When the liquid level height is at or above the top liquid level sensor 152 (vertical height H4) the state machine receives a signal Liquid Level HH and the state machine 500 is placed in a High High state.

At the Low Low state, in some embodiments, the state machine 500 prompts the gas delivery controller 291 to activate or increase one or more of the gas supply 279 and bulk valve 224 of FIGS. 2-3, thus refilling the ampoule 400. In some embodiments, at the Low Low state, the state machine 500 prompts the gas delivery controller 291 to activate or increase one or more of the gas supply 279 and bulk valve 224 until the liquid level has reached the Stop Fill State. Below the Need Fill state, the state machine 500 prompts the gas delivery controller 291 to activate or increase one or more of the gas supply 279 and bulk valve 224. If the liquid level has passed the vertical height H2, the state machine prompts the gas delivery controller 291 to de-activate one or more of the gas supply 279 and bulk valve 224. Due to a time delay in ceasing flow of the gas supply 279, in some embodiments, the liquid level passes above the height H2. In some embodiments, at the Need Fill state, the state machine 500 prompts the gas delivery controller 291 to activate or increase one or more of the gas supply 279 and bulk valve 224 until the liquid level has reached the Stop Fill State. At the Stop Fill state, the state machine 500 prompts the gas delivery controller 291 to de-activate one or more of the gas supply 279 and bulk valve 224.

As explained in further detail below, in some embodiments, the machine 500 prompts one or more of the sensor controller 170 or gas delivery controller 291 to warn or notify or display a prompt to a user interface indicating the state of the state machine 500 or the liquid level. In some embodiments, at the Low Low state, the state machine 500 prompts one or more of the sensor controller 170 or gas delivery controller 291 to warn or notify or display a prompt to a user interface indicating that the ampoule 400 is below a critical liquid level. In some embodiments, at the High High state, the state machine 500 prompts one or more of the sensor controller 170 or gas delivery controller 291 to warn or notify or display a prompt to a user interface indicating that the ampoule 400 is above a critical liquid level.

In some processing scenarios, the auto-refill system 200, including the state machine 500 and control software 190, refill and monitor the liquid levels of multiple ampoules concurrently. In some embodiments, the auto-refill system 200, including the state machine 500 and control software 190 implements and activates the method 300 and the state machine 500 dependent upon a batch of substrates being processed within the processing chamber 283. Thus, as explained in further detail below, the auto-refill system 200, including the state machine 500 and control software 190 activates the method 300 and the state machine 500 before, during or midway through a predetermined batch of substrates being processed.

As shown in FIG. 7, each of the aforementioned liquid level heights of FIG. 5 corresponds to a state of a state machine 600, the state machine 600 incorporating the machine states of the state machine 500 of FIG. 6. FIG. 7 illustrates the machine states of the state machine 600 under multiple batches during multiple substrate manufacturing processes of the processing chamber 283. Multiple batches can be of the same or different process recipes. Multiple batches can comprise sequential and uninterrupted batches of the same recipe with or without downtime. An ampoule of the present disclosure can be refilled before a single or multiple batches, after a single or multiple batches, in-between batches or during batches. The processing chamber 283 is configured to process substrates, transfer a substrate, start or stop a particular batch recipe while processing one or more substrates for a total batch count.

For multiple batches having a total batch count, the following states of the state machine 600 can occur, and the state machine 600 can prompt one or more of the components of the auto-refill system 200 to perform an action. Said prompts can occur during, before or after one or more of the multiple batches for the duration of the total batch count.

If the state machine 500 is in the Low Low state (liquid level LL, vertical height H1) and the processing chamber 283 is transferring a substrate, the state machine 600 is placed in a Batch Start Fill state. Alternatively, if the state machine 500 is in the Need Fill State (liquid level L, vertical height H2) and the processing chamber 283 is transferring a substrate and the processing chamber 283 is at least partially complete with a predetermined batch counter, the state machine 600 is placed in a Batch Start Fill state. The Batch Start Fill State of the state machine 600 prompts the gas delivery controller 291 to activate or increase one or more of the gas supply 279 and bulk valve 224 until the liquid level has reached the Stop Fill State (above or at liquid level H) or a Batch Stop Fill state has been reached. In some embodiments, if the state machine 500 is in the Low Low state, the gas delivery controller 291 will send a warning indicator to a user interface but the processing of the processing chamber 283 will remain uninterrupted. In some embodiments, the Low Low state promotes the gas delivery controller 291 to send a warning indicator to a user interface and cease processing of the 283.

If the state machine 500 is between the liquid level L and liquid level H (between vertical height H2 and vertical height H3), the state machine 600 is placed in the Batch Stop Fill state. Alternatively, if the processing chamber 283 is starting, but has not yet started a recipe, the state machine 600 is placed in the Batch Stop Fill state. Alternatively, if the state machine 500 is between the liquid level LL and over the liquid level L (between vertical height H1 and over vertical height H2), the state machine 600 is placed in the Batch Stop Fill State. The Batch Stop Fill state of the state machine 600 prompts the gas delivery controller 291 to deactivate or decrease one or more of the gas supply 279 and bulk valve 224.

In some embodiments, if the liquid level passes above the vertical height H3, or activates the sensor at vertical height H3, the state machine 500 is placed in a Dump State in which the state machine 500 prompts the gas delivery controller 291 to expel liquid from the ampoule 100 and the gas delivery controller 291 will send a warning indicator to a user interface but the processing of the processing chamber 283 will remain uninterrupted. In some embodiments, the Dump State will send a warning indicator to a user interface and cease processing of the 283.

As previously stated, if the liquid level has passed the vertical height H2, the state machine prompts the gas delivery controller 291 to de-activate one or more of the gas supply 279 or bulk valve 224. Due to a time delay in ceasing flow of the gas supply 279, in some embodiments, the liquid level passes beyond the vertical height H2. In some embodiments, if the processing chamber 283 is processing substrates and the liquid level is at the height H2, the state machine 500 is placed in a Batch Mid Fill state. The Batch Mid Fill State of the state machine 600 prompts the gas delivery controller 291 to deactivate one or more of the gas supply 279 and bulk valve 224 but does not cease the processing chamber 283 from processing substrates. In some embodiments, the Batch Mid Fill State of the state machine 600 further initiates a batch count stored in a data structure for storing precursor-specific data to count a number of substrates processed until the liquid level has passed below the vertical height H2. In some embodiments, as the liquid level decreases due to continuous processing of the processing chamber 283, the state machine 600 prompts the gas delivery controller 291 to deactivate one or more of the gas supply 279 and bulk valve 224 if the liquid level passed below the vertical height H2. In some embodiments, if the Batch Mid Fill state is reached more than three consecutive occurrences, the gas delivery controller 291 will send a warning indicator to a user interface but the processing of the processing chamber 283 will remain uninterrupted. The batch count of the Batch Mid Fill state provides a count for determining the number of substrates processed between mid-fills of the Batch Mid Fill state.

FIG. 8A and FIG. 8B illustrate state machine 500 and state machine 600 respectively. It is understood that the illustrated state machines (500, 600) are simplified representations and that state machines used for real time control of a semiconductor process are more complex, having significantly more states and transitions than illustrated in the figures. As previously illustrated in FIG. 6, the state machine 500 includes a number of states including the Low Low state, the Need Fill state, the Stop Fill state and the High High State. Likewise, the state machine 600 incorporates at least one of the states of the state machine 500 and the state machine 600 includes a Batch Start Fill state and a Batch Stop Fill state. In some embodiments, the state machine 600 further includes an optional Batch Mid Fill state.

By way of example, and as previously set forth, the states may represent the states of the one or more of the liquid level sensors (150, 152, 154, 156), operation of the bulk valve 224, heater 226 needle valve 265, the gas supply 279 and flow of gas to the processing chamber 283. Each change from one state to another state occurs through a transition, such as a first transition 510 of the state machine 500 or a first transition 610 of the state management 600. It will be noted that each state may have one or more transitions into and out of that state. This may be, for example, a control signal or a sensor output that triggers a response by an item of hardware to transition to a different state.

FIGS. 8A and 8B illustrate simple state machines, however other techniques can be employed to represent said state machines. By way of example, the state machines 500 and 600 as represented by state tables in FIGS. 6 and 7 respectively have related states and conditions in tabular form. In some embodiments, the state machines 500 and 600 provide for binary conditions for transitions while, by way of example, state machine 600 provides for a generalized expression for evaluating state changes. Other commonly used representations for software implementations of state machines include algorithmic state machines, Unified Modeling Language ("UML") state diagrams, directed graphs, and so forth.

Figure 9:
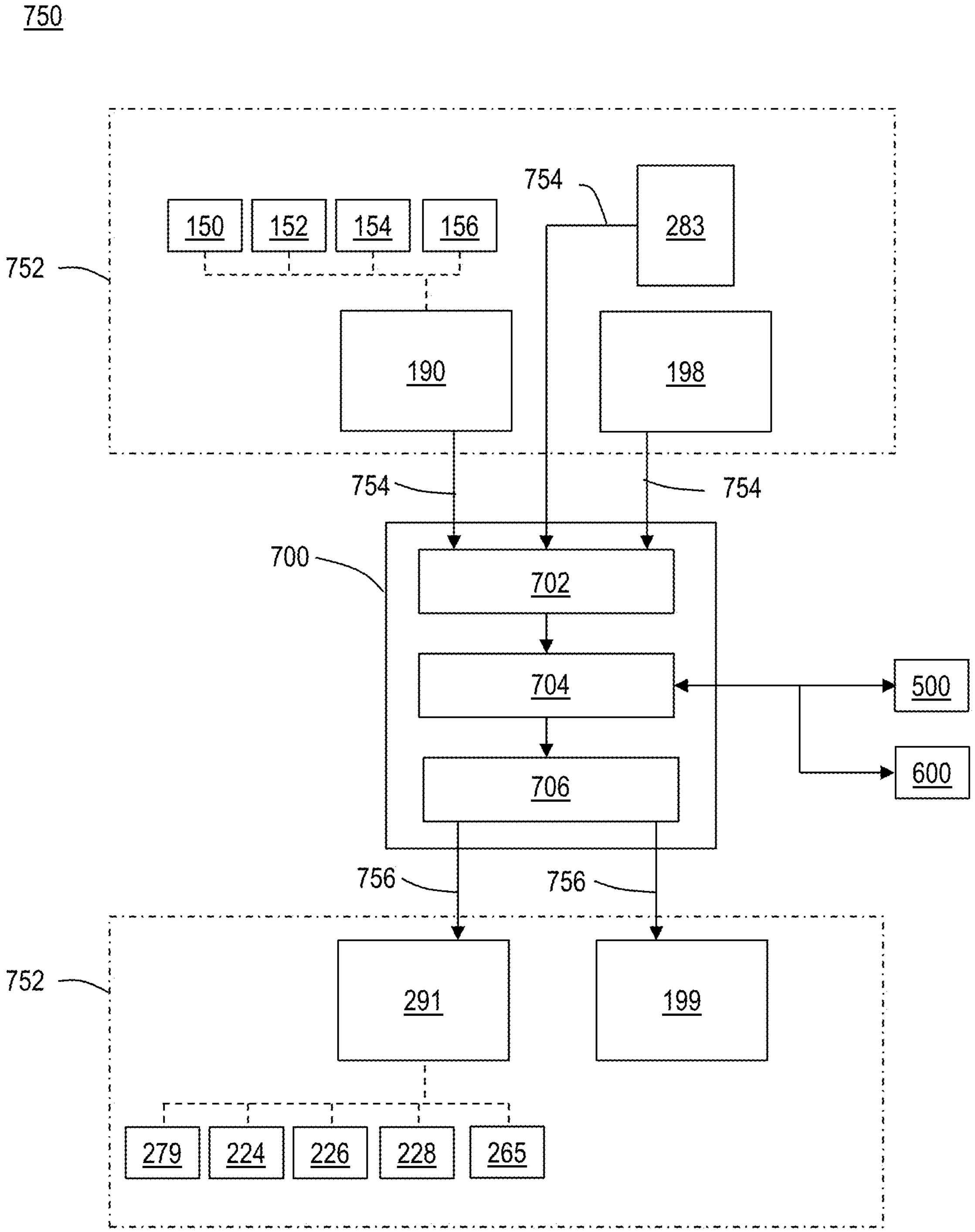
FIG. 9 shows a schematic of a control system and a neural network 700 in accordance with one or more embodiment of the disclosure.

FIG. 9 illustrates a control system 750 including a neural network 700 configured to receive inputs from and send outputs to the handling hardware 752. In some embodiments, the handling hardware 752 includes one or more of the sensor controller 170, the liquid level sensors (150, 152, 154, 156), gas delivery controller 291, bulk valve 224, heater 226, gas pressure sensor 228, needle valve 265, and the gas supply 279. In some embodiments, the neural network 700 is further configured to receive user inputs from a user input interface 198. By way of example, user inputs may include precursor-specific parameters, process recipes and batch counts. In some embodiments, the neural network 700 is configured to send outputs to a user output interface 199. By way of example, user outputs may include a graphical user interface for human monitoring and control. It will be understood that the neural network as depicted is a generalized representation. In general operation, the handling hardware 752 provides inputs 754 to the neural network 700, and the neural network 700 in turn calculates one or more states of a finite state machine of one or more of the previous embodiments (state machine 500, state machine 600). These states, in turn, provide control signals to the handling hardware 752 by outputs 756 from the neural network to the handling hardware 752.

The inputs 754 to the neural network 700 may include any data derived from the handling hardware 752, such as sensor data from optical sensors, pressure gauges, switches, and so forth. In some embodiments, the inputs 754 also include robotic data or process data from the processing chamber 283 such as the recipe being processed and the batch count. In some embodiments, the processing chamber is a component of the handling hardware 752. In some embodiments, the inputs 754 may also include processed sensor data in which data processing occurs by the individual components of the handling hardware 752. By way of example, an individual component of the handling hardware 752 is converted into a Boolean representation of the component status. In some embodiments, the inputs 754 to the neural network 700 include system information such as a pick time, a processing status, a transition time of a substrate or a batch of substrates and so forth. Broadly, the inputs 754 are in the form of any raw or processed data available from the handling hardware 752.

In some embodiments, the inputs 754 and outputs 756 of the control system may include vectors, real numbers, complex numbers and the data may be represented as integers, floating point values, or any other numerical representation suitable for use with the neural network 700. In some embodiments, the inputs 754 and outputs 756 are asynchronous 608.

As illustrated, the neural network 700 includes a three-layer network of objects. In particular, a top level or top layer 702 of the neural network 700 at the input layer receives input data or input signals from the sensor controller 170, and, in some embodiments, from the user input interface 198. An output may be produced by the bottom level at the output layer and sends the output to the gas delivery controller 291, and in some embodiments, to the user output interface 199.

In embodiments, each of the objects may be implemented on a single, uniprocessor computer; a plurality of uniprocessor computers; a single, multiprocessor computer; a plurality of multiprocessor computers and so forth. In some embodiments, the neural network 700 provides a parallel computation of an input vector to an output vector across a plurality of objects. In some embodiments, the objects nodes may be evaluated or calculated using an algorithm. Execution of the evaluation may operate in parallel or sequentially, locally on one computer or distributed across a plurality of computers. The architecture may employ multi-threading, multi-tasking, distributed computing, batch computing, timeshare computing, remote procedure calls, client-server computing, peer-to-peer computing, SIMD computing, MIMD computing, SISD computing, MISD computing, a service-oriented architecture, an n-tier architecture, a monolithic software architecture, a modular software architecture or other architectures known in the art.

Each of the levels (or layers) comprise objects, the objects containing any number of artificial neurons. In some embodiments, there are any number of objects in the input layer 702, output layer 706, and middle layer 704. In some embodiments, the number of objects at the input layer 702 correspond to a number of components of the inputs and the number of objects at the output layer 706 correspond to the number of components of the outputs. In some embodiments, the number of objects in the middle layer 704 are, by way of example, an average number of objects in the input layer 702 and output layer 706.

In one or more embodiments, each of the objects of the one or more layers (702, 704, 706) of the neural network 700 are fully connected to objects of adjacent layers. Stated differently, the output from individual objects in the input layer 702 is provided as an input to each and every object in the middle layer 704. Likewise, the output from each and every object in the middle layer 704 is provided as an input to each and every object of the output layer 706.

In some embodiments, the neural network 700 provides promts to a finite state machine, such as the state machine 500 and state machine 600 of the previously described embodiments. In some embodiments, the neural network 700 is a neural network scheduler. In some embodiments, the neural network scheduler operates to process inputs and calculate states of the one or more of the state machine 500 and state machine 600. The states of the of the one or more of the state machine 500 and state machine 600 may employ any current value, signal or data of the neural network schedule to determine whether a condition for transition from one state to another is required, and generate any suitable control signals to the handling hardware 752.

In some embodiments, the state machines of the present disclosure may employ multiple concurrent states. In some embodiments, the state machines of the present disclosure comprise multiple daughter state machines for individual components of the auto-refill system 200, the daughter state machines evaluating one or more tasks of the state machine 500 or state machine 600 for discrete groups of hardware.

Figure 10:
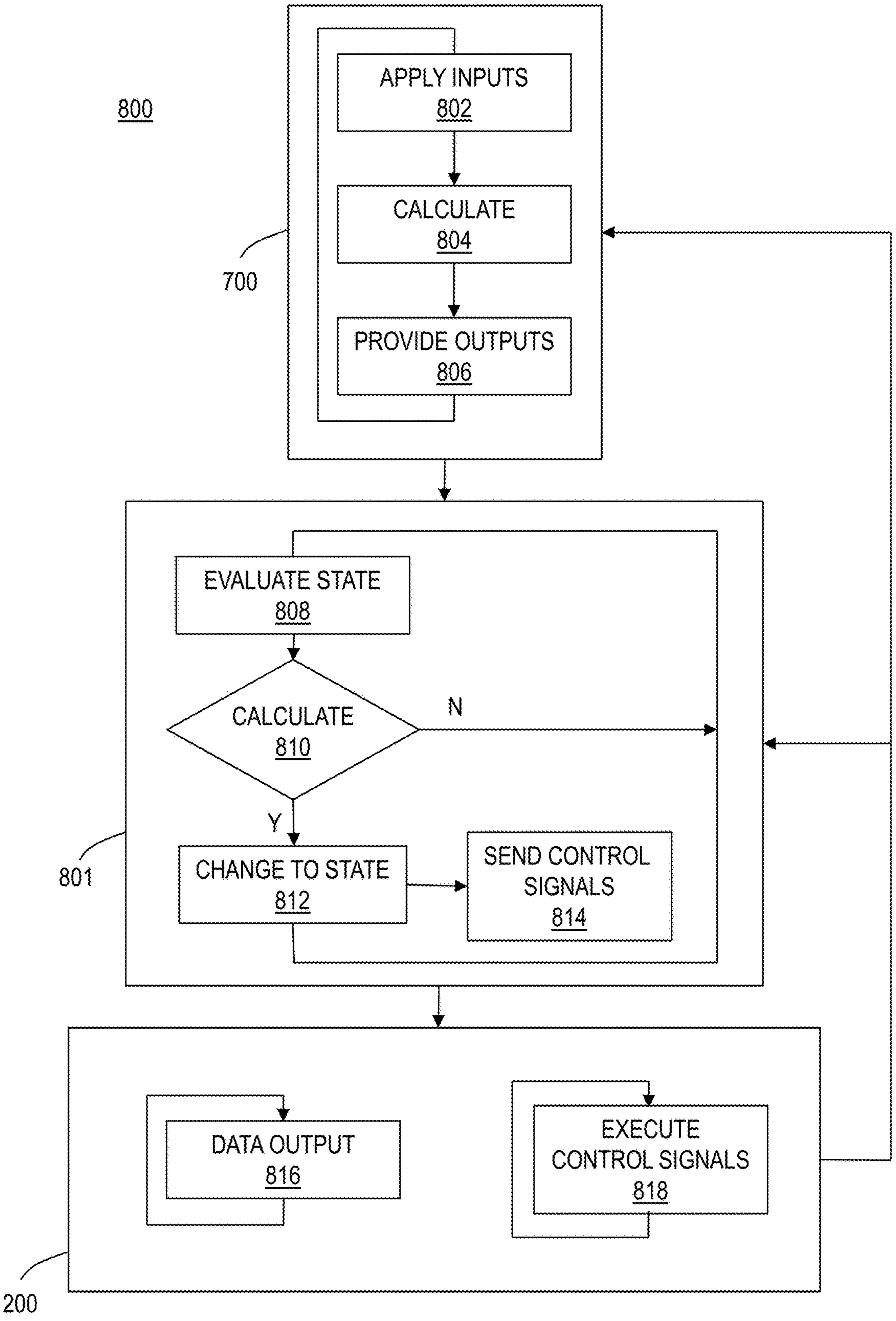
FIG. 10 shows a process for controlling an auto-refill system with a finite state machine and a neural network in accordance with one or more embodiment of the disclosure.

FIG. 10 illustrates a process 800 for controlling the auto-refill system 200 with a finite state machine 801 and the neural network 700 of one or more previously described embodiments. In some embodiments, the finite state machine 801 is one or more of the state machines (500, 600) of the previously described embodiments The neural network 700 receives data from the auto-refill system 200 and the data inputs are applied to the 700 as shown in step 802. The neural network 700 then processes nodes as shown in step 804 to calculate outputs as shown in step 806. The finite state machine 801 evaluates current states as shown in step 808 to determine whether to transition to another state as shown in step 810, using the outputs from the neural network 700. If at step 810 a transition is determined to be appropriate, the finite state machine 801 then proceeds to change to a new state as shown in step 812 and generates corresponding control signals for output to the system 730. If at step 810 a transition is not appropriate, the finite state machine 801 will return to re-evaluate the current state at step 808. In some embodiments and as previously set forth, transitions from one state to another may be conditional transitions and thus a state may conditionally transition to another state when pressure in a process tool interior chamber is below a threshold, with the threshold represented by a weight from the neural network. Similarly, in some embodiments the transitions are Boolean values and/or expressions or sensor data or signals. In other embodiments, the weights may represent values assigned to a number of possible transitions from a state In some embodiments, the auto-refill system 200 receives the control signals created and sent by the state machine 801 at step 814. In some embodiments, the auto-refill system 200 executes control signals continuously at step 816 and in some embodiments, generate data output continuously 818. It will be appreciated that the timing for these steps may be continuous or periodic and synchronous or asynchronous.

Figure 11:
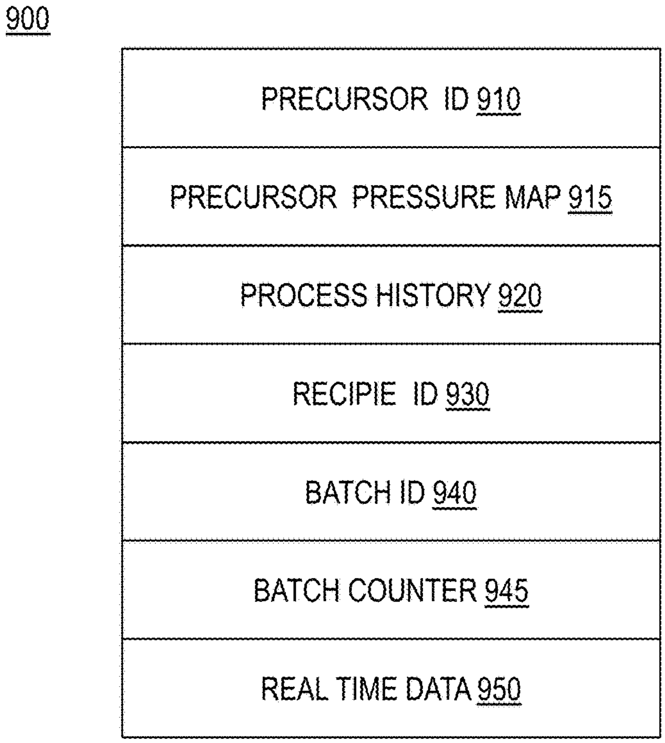
FIG. 11 shows a schematic of a data structure in accordance with one or more embodiment of the disclosure.

FIG. 11 shows a data structure 900 for storing precursor-specific data. The data structure 900 may generally include a precursor identifier 910, a precursor pressure map 915, a process history 920, a recipe identifier 930, batch identifier 940, a batch counter 945 and real time data 950.

The data structure 900 may be implemented as an XML database, a relational database, an object-relational database, or any other database or data structure suitable for storing information as described herein. The data structure 900 may be embodied in a volatile memory such as memory allocated for execution of a control program, or in non-volatile memory such as a fabrication facility data repository, or some combination of these. Storing wafer data in a single data structure may provide significant advantages including easier access to wafer-specific data and greater portability of data for a wafer, including for example the data described below.

In some embodiments, the data structure 900 includes the precursor identifier 910 and the precursor pressure map 915 which identify and/or describes the precursor being supplied by the gas supply 279. This may include a number or other code that uniquely identifies the wafer either globally or within a particular fabrication facility, wafer lot, or other appropriate context. The precursor identifier 910 may also include descriptive data such as chemical characteristics of the precursor.

In some embodiments, pressure data can be used to match chamber to chamber chemical delivery over multiple chambers for a given precursor. In particular, the pressure map 915 can be applied to one or more gas delivery controllers 291 and processing chambers 283 over a batch. By way of example but not limitation, in two exemplary processing chambers with different precursor gases, different restrictor and gas conduit lengths, matching a given pressure map 915 with said parameters with the amount of chemical delivered from the gas supply 279 and mass flow controller 244 establishes uniformity between said two processing chambers with different precursor gasses. Stated differently, by matching different pressures across different precursors over the gas pressure sensor 228, the amount of chemical delivered from the gas supply 279 and mass flow controller 244 can be adjusted for uniformity and control over multiple processing chambers.

In some embodiments, the data structure 900 includes a process history 920 that contains an event log, recipes, process steps, and the like for one or more processing chambers. Thus a full or partial history of one or more processing chambers is stored in the data structure 900 for subsequent review or archiving.

In some embodiments, the data structure 900 includes a recipe 930 for processing one or more substrates. This may be a current or prospective recipe applicable to a particular substrate or chamber process. Where a substrate is one of a number of substrates intended for a batch or other group process, the recipe 930 may contain a reference to an external (from the data structure) data location that contains the recipe, so that a single recipe may be shared among a number of processing chambers.

In some embodiments, the data structure 900 includes a batch identifier 940 including a batch counter 945 that stores a batch process or a number of given processes for a batch.

In some embodiments, the data structure 900 includes real time data 950 for the precursor characteristics stored in the precursor identifier 910. This data may include a number of fields, such as in a related table, for various data types such as temperature, pressure, amount of refills during a given batch or recipe.

It is understood that other fields are possible, and that each field may contain a single data item, a series of data items, or a reference to a table or external data source that contains corresponding data. It will further be appreciated that the data may be embodied in an object-oriented data structure, an XML data structure, a relational database, or any other form suitable for storage and retrieval of data in fields thereof. As a significant advantage, the data structure 900 may encapsulate any relevant data for a wafer, and may be readily ported to any other environment. Thus the data structure 900 may be stored in a fabrication facility data repository where it may be used in a current process as well as any subsequent processes. The data structure 900 may be transported with the wafer to other fabrication facilities, and used by a variety of different programs to analyze the wafer including facility-wide programs to calculate yield, throughput, or the like as well as specific handling/processing systems where the wafer is to be processed. Other advantages will be clear from the foregoing, including an ability to maintain physical models of a wafer that permit more efficient and/or accurate processing decisions during a fabrication process.

Figure 12:
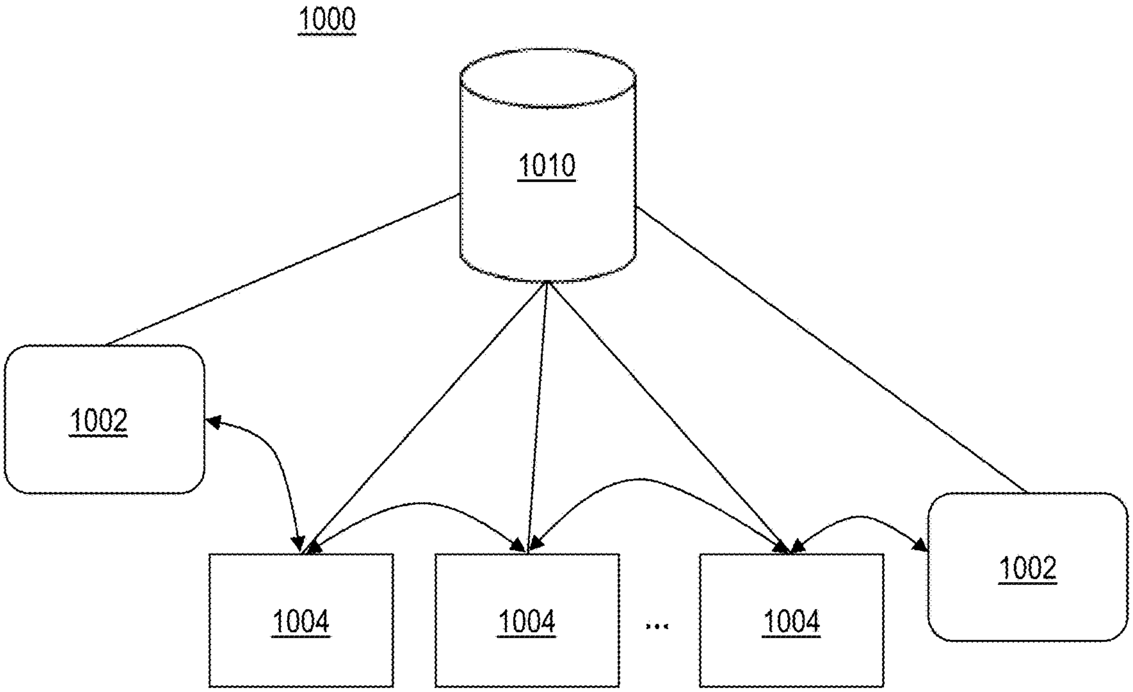
FIG. 12 shows a schematic of a system in accordance with one or more embodiment of the disclosure.

FIG. 12 illustrates a system 1000 for utilizing precursor and processing information to control an ampoule refill process. In the system 1000, an automatic, semi-automatic, or manual process, or combinations thereof, direct a gas delivery system 1002 through one or more refill 1004. Data may be gathered throughout the process and forwarded to a database 1010 where the data may be stored with or otherwise indexed by a data structure associated with the gas delivery system 1002. In some embodiments, data such as vertical liquid level, the status of one or more components, pressure, temperature, gas delivery volume and the like are acquired from sensors within the system 1000. In some embodiments, said data is be forwarded to the database 1010 and associated with other data for the gas delivery system 1002.

Each refill 1004 may receive data and/or apply control signals to (e.g., to control a robot or processing module) the gas delivery system 1002. Through states or refills 1004 of the gas delivery system 1002, a record, object, or other data structure may be created in the database 1010. The data structure may be associated with or indexed by a data of the data structure 900 as described above.

In some embodiments, the action or measurement performed by the gas delivery system 1002 is recorded in the database 1010, along with any instances of related data, metadata, or sensor data. Any or all of these values, data, and metadata may be stored in the database 1010 in association with the gas delivery system 1002. It will be appreciated that, while a linear system is depicted, the gas delivery system 1002 may be passed from one refill to another, in an arbitrary order.

In one aspect, the database 1010 may be maintained in real time. The database 1010 may encompass information about the state of a refill 1004 and/or the gas delivery system 1002 itself, and any other relevant data. The database 1010 may be available to a user interface or refill management system. The database 1010 may be available in real time. In embodiments, the database 1010 may be stored by an SQL database management system, an XML database management system, or any other database management system or data storage system. In any case, the database may be stored offsite and away from the system (database 1010).

Figure 13:
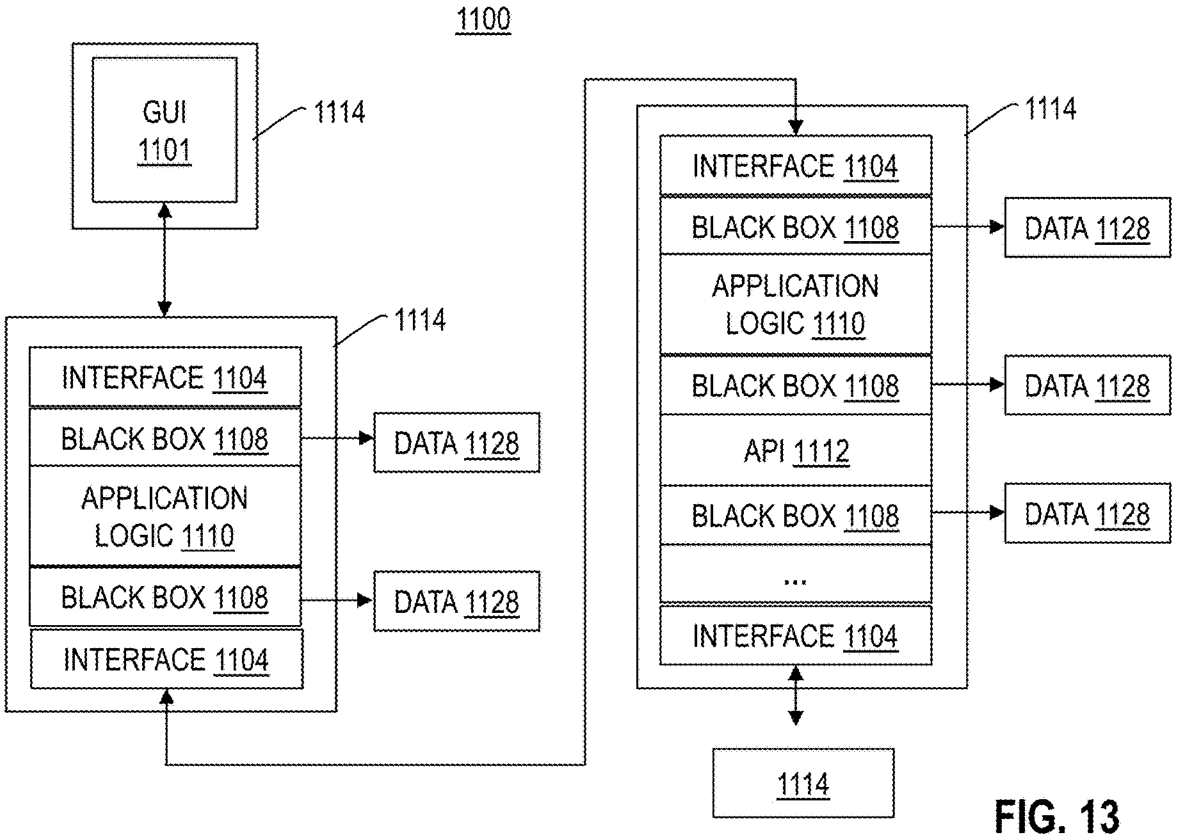
FIG. 13 shows a schematic of a software system in accordance with one or more embodiment of the disclosure.

FIG. 13 illustrates an exemplary software system 1100 which comprises a graphical user interface (GUI) 1102, a plurality of interfaces 1104, a plurality of black box recorders 1108, a plurality of application logics 1110, and a plurality of APIs 1112. As shown, the software modules are arranged in a stack. In some embodiments, modules are grouped together to form one or more applications 1114. The applications 1114 may communicate via interface 1104 software modules.

As illustrated, in some embodiments, there is a GUI 1102 application 1114, an logic application 1114 containing application logic 1110 and an application 1114 containing application logic 1110 and one or more APIs 1112. One or more of the black box recorders 1108 produce data 1118. In some embodiments, the data 1118 includes information about a state of the software modules. In some embodiments, the information corresponds to data or information that is sent and received between the modules. In some embodiments, the information is in the form of an alert, an error message, a status message, or other messages related to the operation of the software module. In some embodiments, one or more of the black boxes 1108 access a software module and extract data or information from the software module. In some embodiments, this is implemented as a method call to the software module. In embodiments, the black box 1108 and software module are implemented as an aspect in an aspect-oriented programming algorithm. The data 1118 may be utilized to help determine a state of the system.

Figure 14:
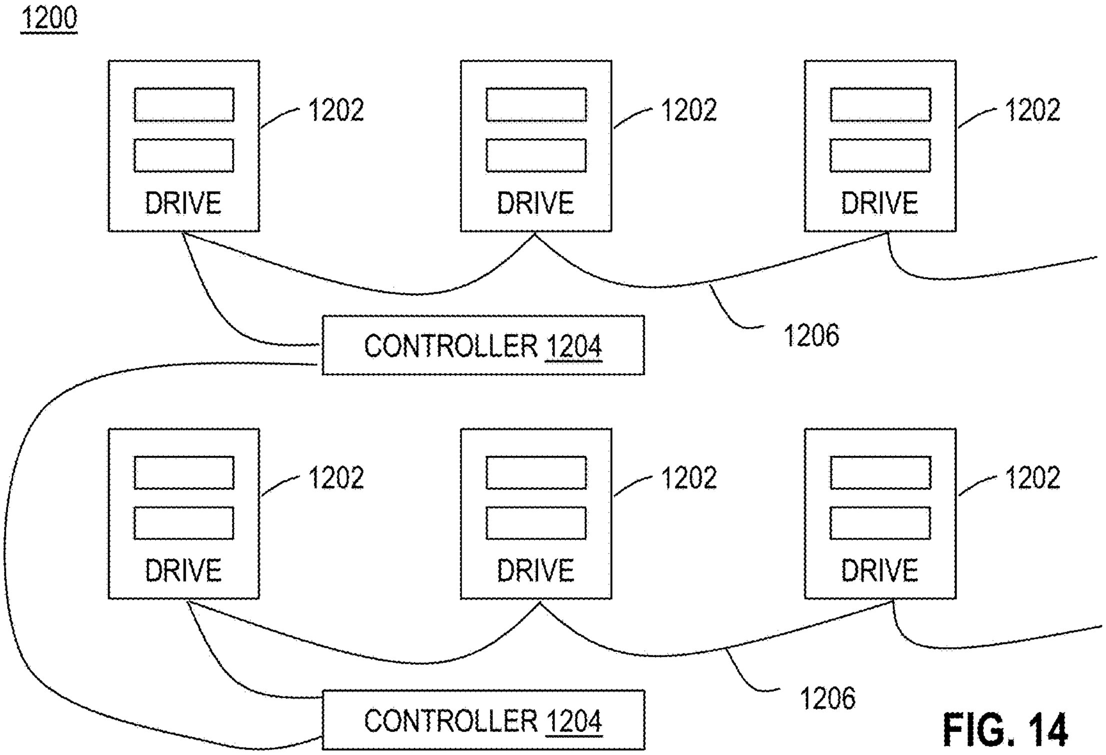
FIG. 14 shows a schematic of a network in accordance with one or more embodiment of the disclosure.

FIG. 14 illustrates a network for interconnecting process hardware. The system 1200 comprises a plurality of controllers 1204, which in some embodiments employ any of the control software and/or data structures described in previous embodiments. In some embodiments, the controllers 1204 are connected to one or more of the components 1202 (e.g., controllers, valves, etc.) or sensors described herein including other process hardware using a shared physical medium 1206. In some embodiments, the shared medium 1206 is, by way of example, a hard wired or a serial connection so that the controllers and/or components 1202 are interconnected using a single communications bus.

Reference throughout this specification to "one embodiment," "certain embodiments," "various embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in various embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein provided a description with reference to particular embodiments, it is to be understood that these embodiments are merely illustrative of the principles and applications of the disclosure. It will be apparent to those skilled in the art that various modifications and variations can be made to the present disclosure without departing from the spirit and scope thereof. Thus, it is intended that the present disclosure include modifications and variations that are within the scope of the appended claims and their equivalents.

What is claimed is:

1. A system comprising:

a state machine that controls operation of an auto-refill system and activates or deactivates a bulk valve of the auto-refill system, the auto-refill system comprising a plurality of liquid level sensors and a bulk valve, each of the plurality of liquid level sensors configured to send a signal to a sensor controller for detecting a liquid level in an ampoule, a first liquid level sensor of the plurality of liquid level sensors configured to determine a low liquid level state of the ampoule; a second liquid level sensor of the plurality of liquid level sensors configured to determine a full liquid level state of the ampoule; wherein when the liquid level is at the first liquid level sensor the state machine activates the bulk valve to refill the ampoule; wherein when the liquid level is at the second liquid level sensor the state machine deactivates the bulk valve;

a neural network that receives an input signal from the plurality of liquid level sensors and provides as outputs activation of the bulk valve and deactivation of the bulk valve, and/or weights for one or more of a plurality of transitions from one state to another;

wherein the state machine is configured to send control signals to the auto-refill system and control processing that activates or deactivates the bulk valve, the state machine is separated from operation of the bulk valve such that the state machine operates to send the control signals independent of the neural network to provide transitions among states according to input from the auto-refill system to refill the ampoule.

2. The system of claim 1, wherein the state machine has one or more states and at least one of the one or more states represents a state of an item of hardware within the auto-refill system, and at least one of the one or more states represents a signal sent to one or more of a gas delivery valve or the bulk valve.

3. The system of claim 2, wherein at least one of the one or more states have a condition dependent on the liquid level within the ampoule.

4. The system of claim 2, wherein the state machine has a High High state corresponding to a liquid level H4, a Stop Fill state corresponding to a vertical liquid level H3, a Need Fill state corresponding to a vertical liquid level H2, and a Low Low state corresponding to a vertical liquid level H1, the Need Fill state prompting a gas delivery controller to activate the bulk valve, the Stop Fill state prompting the gas delivery controller to deactivate the bulk valve.

5. The system of claim 2, wherein the state machine has a Batch Start Fill state which prompts a gas delivery controller to activate the bulk valve until the liquid level is above or at liquid level H.

6. The system of claim 2, wherein the state machine has a Batch Stop Fill state which corresponds to a liquid level between vertical height H2 and vertical height H3, the Batch Stop Fill state prompts a gas delivery controller to deactivate the bulk valve, the Batch Stop Fill state corresponds to a processing chamber starting, but has not yet started a recipe, and/or the Batch Stop Fill state corresponds to a liquid level between vertical height H1 and over vertical height H2.

7. The system of claim 2, wherein the state machine has a Batch Mid Fill state which corresponds to a liquid level below vertical height H2 and a processing chamber is not transferring a substrate, the Batch Mid Fill state prompts a gas delivery controller to deactivate the bulk valve.

* * * * *